United States Patent [19]
Taguchi

[11] Patent Number: 5,218,224
[45] Date of Patent: Jun. 8, 1993

[54] SEMICONDUCTOR DEVICE INCLUDING INVERSION PREVENTING LAYERS HAVING A PLURALITY OF IMPURITY CONCENTRATION PEAKS IN DIRECTION OF DEPTH

[75] Inventor: Minoru Taguchi, Oomiya, Japan
[73] Assignee: Kabushiki Kaisha Toshiba, Kawasaki, Japan
[21] Appl. No.: 747,480
[22] Filed: Aug. 13, 1991

Related U.S. Application Data
[63] Continuation of Ser. No. 536,278, Jun. 11, 1990, abandoned.

[30] Foreign Application Priority Data
Jun. 14, 1989 [JP] Japan .................. 1-151527

[51] Int. Cl.[5] .................. H01L 27/02; H01L 27/04; H01L 27/12
[52] U.S. Cl. .................. 257/547; 257/370; 257/552; 257/593
[58] Field of Search .................. 357/41, 42, 43, 47, 357/50; 257/547, 552, 593, 370

[56] References Cited
U.S. PATENT DOCUMENTS
| | | | |
|---|---|---|---|
| 4,013,484 | 3/1977 | Boleky et al. | 148/1.5 |
| 4,589,004 | 5/1986 | Yasuda et al. | 357/43 |
| 4,879,584 | 11/1989 | Takagi et al. | 357/41 |
| 4,921,811 | 5/1990 | Watanabe et al. | 357/43 |

FOREIGN PATENT DOCUMENTS
| | | |
|---|---|---|
| 058604A1 | 8/1982 | European Pat. Off. . |
| 0073942A2 | 3/1983 | European Pat. Off. . |
| 63-77144 | 4/1988 | Japan .................. 357/43 |
| 2206446A | 1/1989 | United Kingdom . |

OTHER PUBLICATIONS
"Silicon Processing for the VLSI Era—vol 2", S. Wolf, Circuit-Layout . . . , pp. 416-419, 1990.
"VLSI Technology", Sze, pp. 487-490, 1988.

Primary Examiner—Rolf Hille
Assistant Examiner—Wael Fahmy
Attorney, Agent, or Firm—Finnegan, Henderson, Farabow, Garrett & Dunner

[57] ABSTRACT

Buried layers of a second conductivity type are formed in a plurality of portions of a surface region of a semiconductor substrate of a first conductivity type, and an epitaxial layer of the first conductivity type is formed on the buried layers and the semiconductor substrate. A plurality of well regions of the second conductivity type are formed in the epitaxial layer in contact with the buried layers, and a region of the second conductivity type with a high impurity concentration is formed in one of the well regions in contact with the buried layers. A field insulating layer is formed on a surface region of the semiconductor substrate between the well regions. An impurity is ion-implanted in a portion substantially immediately below the field insulating film a plurality of times to form inversion preventing layers of the first conductivity type having a plurality of impurity concentration peaks. Active elements are formed in the epitaxial layer of the first conductivity type and the well regions.

6 Claims, 10 Drawing Sheets

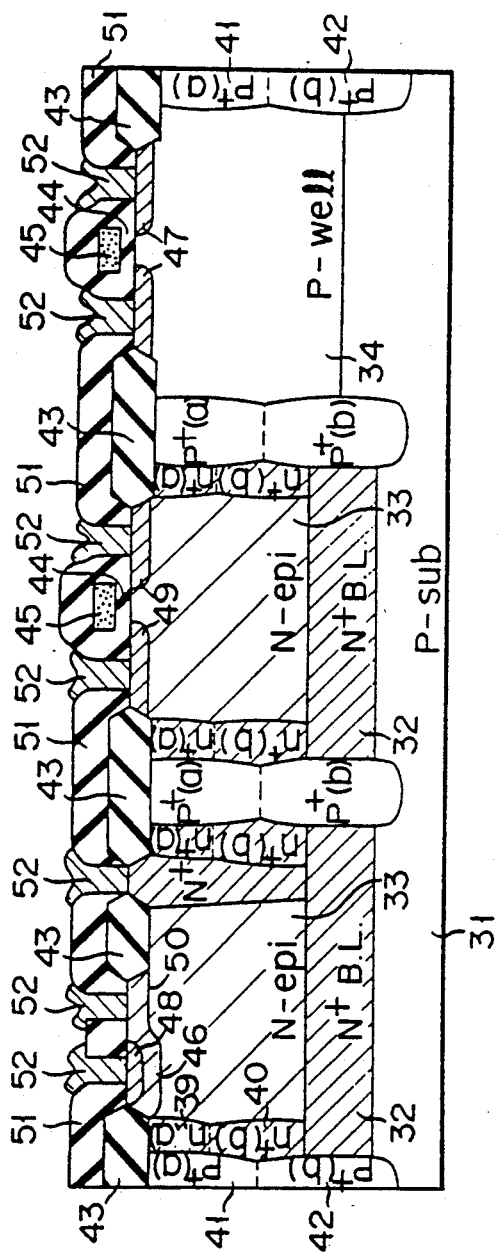
FIG. 6C
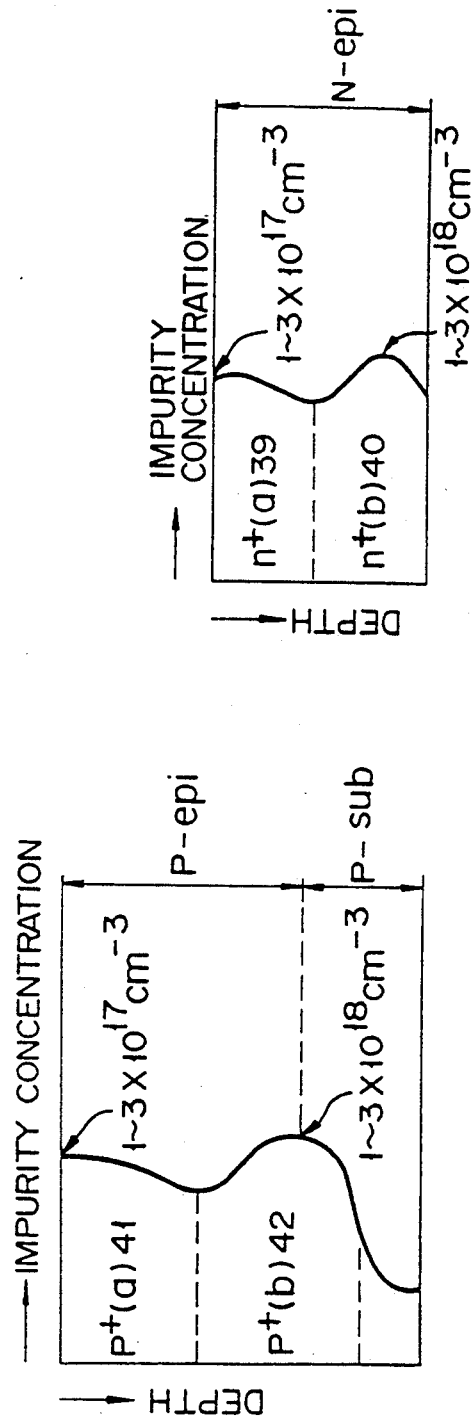
FIG. 7B
FIG. 7A

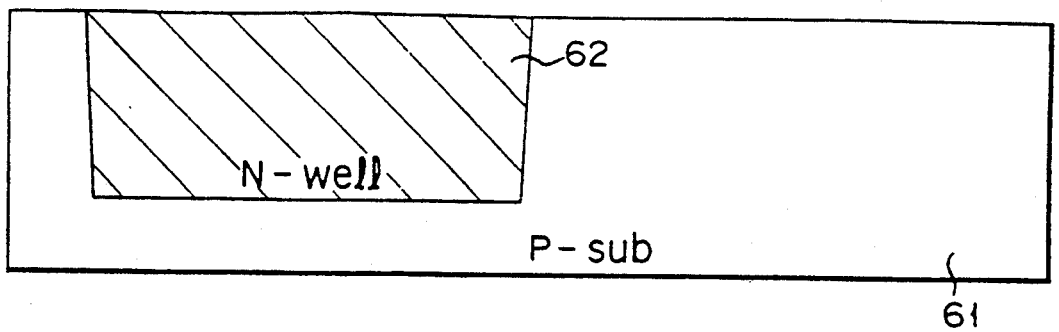
F I G. 8A
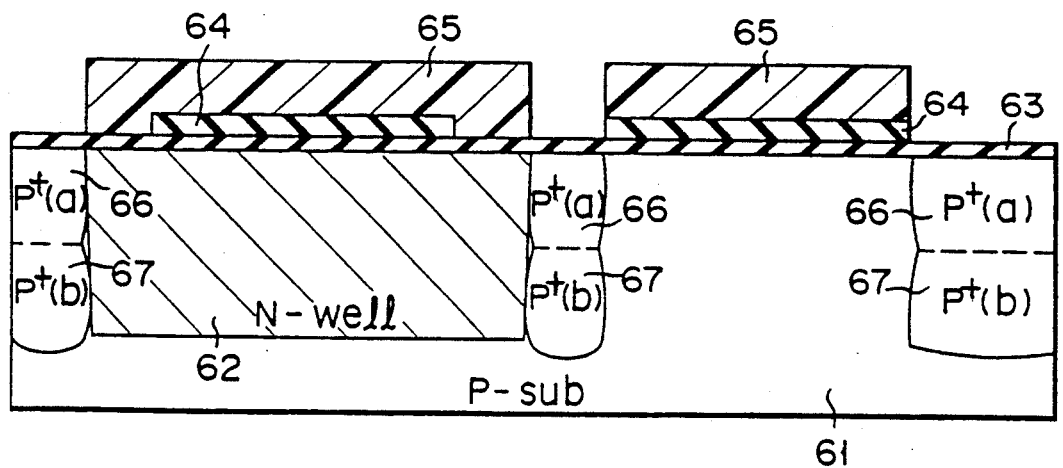
F I G. 8B
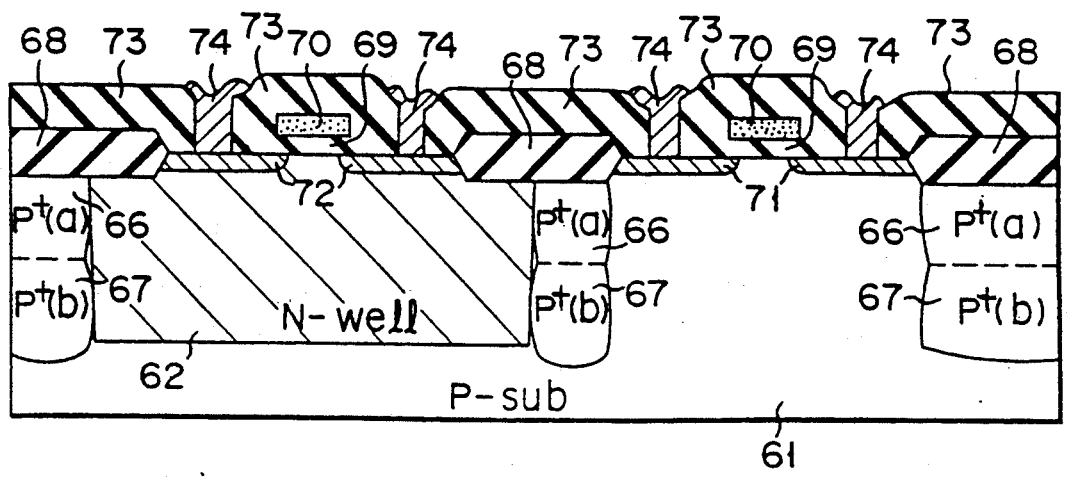
F I G. 8C

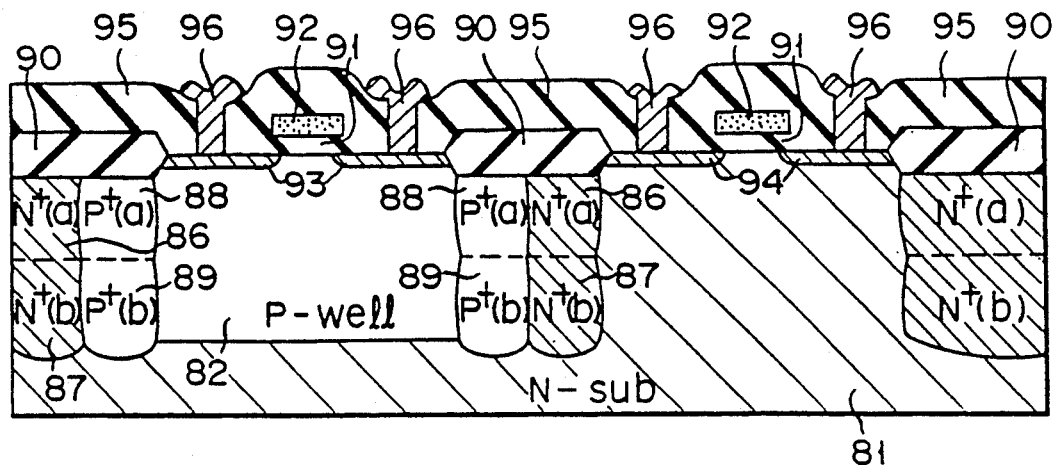
F I G. 10C
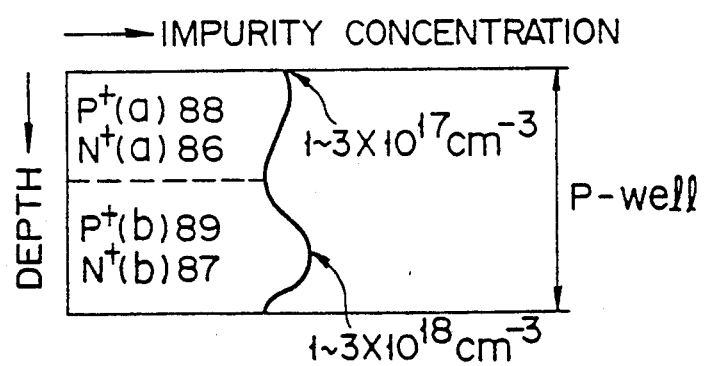
F I G. 11
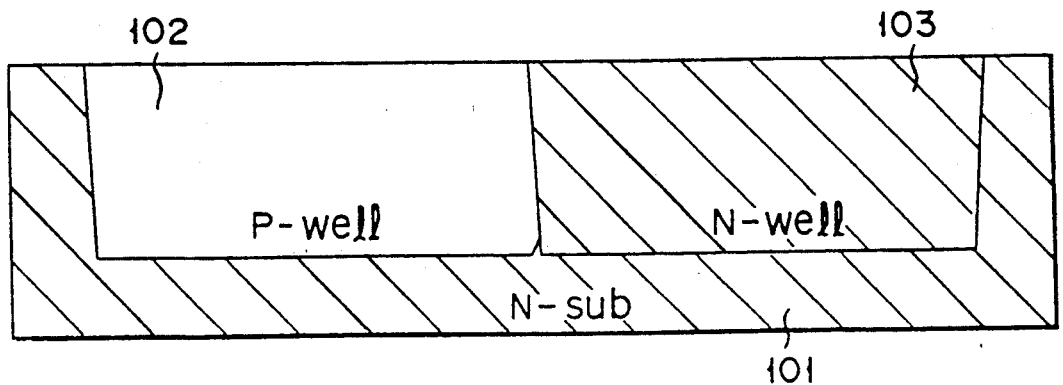
F I G. 12A

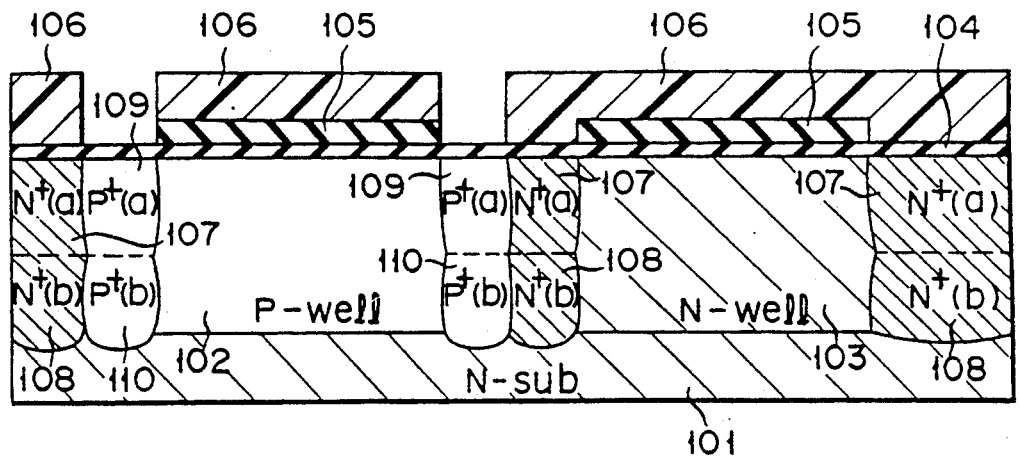
F I G. 12B
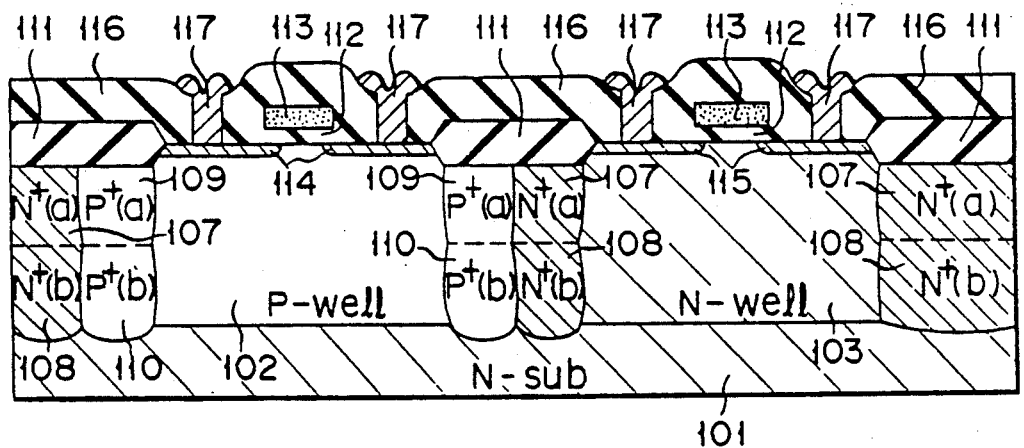
F I G. 12C
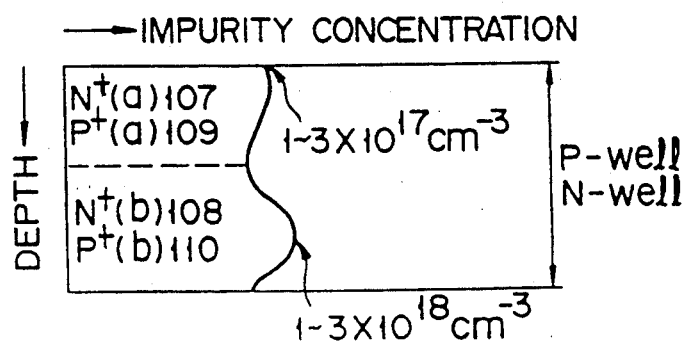
F I G. 13

SEMICONDUCTOR DEVICE INCLUDING INVERSION PREVENTING LAYERS HAVING A PLURALITY OF IMPURITY CONCENTRATION PEAKS IN DIRECTION OF DEPTH

This application is a continuation of application Ser. No. 07/536,278, filed Jun. 11, 1990, now abandoned.

BACKGROUND OF THE INVENTION

1. Field of the Invention

The present invention relates to a CMOS or Bi-CMOS semiconductor device.

2. Description of the Related Art

A CMOS semiconductor device in which n- and p-channel MOSFETs are formed on a single chip is conventionally known. In addition, a Bi-CMOS semiconductor device obtained by adding a bipolar transistor to this CMOS semiconductor device is known.

Recently, LSI manufacturing techniques, especially, unit techniques such as oxidation, diffusion, etching, and exposure have significantly progressed. In accordance with this progress, the occupation area per element on a chip has decreased, and the packing density and operation speed of an LSI have increased. In the CMOS semiconductor device and the Bi-CMOS semiconductor device described above, micropatterning of an element has naturally progressed.

As micropatterning of an element has progressed, a film structure of an insulating film or a profile of an impurity concentration in a substrate, for example, in a semiconductor device has been largely improved to suppress generation of a leakage current, thereby ensuring reliability.

In recent years, however, the reliability of an apparatus for manufacturing an element has not followed the rapid progress in micropatterning of an element. In particular, a parasitic pnpn structure is formed inside an element in the CMOS and Bi-CMOS semiconductor devices. This pnpn structure operates similarly to a thyristor to cause a latch-up phenomenon of the CMOS semiconductor device or a so-called field inversion phenomenon in which a semiconductor layer immediately below a field oxide film is inverted, thereby degrading the reliability of an element. Especially when a CMOS or Bi-CMOS semiconductor device having a micro element structure is manufactured by using a VG (Vapor Growth) wafer as shown in FIG. 1, a latch-up phenomenon caused by a parasitic pnpn structure significantly appears.

The VG wafer shown in FIG. 1 and its problems will be described below.

As shown in FIG. 1, $n^+$-type buried layers A($N^+$B.L.) 122 and $p^+$-type buried layers (P$^+$B.L.) 123 are formed on a p-type semiconductor substrate 121, and an n-type epitaxial layer 124 is formed thereon.

In a method of manufacturing such a VG wafer, an oxide film or a photoresist is used as a mask to selectively vapor-phase-diffuse antimony (Sb) as an n-type impurity on the p-type semiconductor substrate 121, thereby forming the $n^+$-type buried layers 122. Similarly, an oxide film or a photoresist is used as a mask to selectively vapor-phase-diffuse boron (B) as a p-type impurity to form the $p^+$-type buried layers 123 on the substrate 121. The n-type epitaxial layer 124 is formed on the entire surface by a CVD method at a temperature of, e.g., 1,100° C. to 1,250° C. During this formation, however, boron (B) having a high diffusion coefficient is unnecessarily diffused in the n-type epitaxial layer 124, resulting in a dull profile of impurity concentration in the $p^+$-type buried layers 123.

FIG. 2 shows a profile of an impurity concentration of a section taken along a line 2—2 in FIG. 1. For comparison, FIG. 3 shows a profile of an impurity concentration of a section taken along a line 3—3 in FIG. 1. As is apparent from FIGS. 2 and 3, the impurity concentration of the $p^+$-type buried layers 123 is decreased by growing the n-type epitaxial layer 124. When the impurity concentration of the layers 123 is decreased, insulating performance of the $n^+$-type buried layers 122 formed in contact with the layers 123 is reduced which may cause a latch-up phenomenon. In order to solve this problem, an impurity concentration of the $p^+$-type buried layers 123 may be set higher in consideration of the fact that the profile of the impurity concentration becomes dull. In this case, however, the amount (unnecessary diffusion amount) of leakage of boron is further increased. An increase in boron leakage amount adversely affects an active element formed in the n-type epitaxial layer 124. For example, a threshold value varies in a MOSFET, or a withstand voltage is reduced or an early voltage is degraded in a bipolar transistor.

The above phenomenon occurs not only when an n-type epitaxial layer is formed as described above but also when a p-type epitaxial layer is formed.

In addition, leakage of boron having a high diffusion coefficient into an epitaxial layer occurs not only during formation of the epitaxial layer but also during a heating step (normally at 1,100° C. to 1,250° C.) for forming a well region in a epitaxial layer (not shown). This makes it more difficult to solve the above problem.

SUMMARY OF THE INVENTION

It is an object of the present invention to provide a Bi-CMOS or CMOS semiconductor device having a micro element structure, in which a high impurity concentration is obtained in an inversion preventing layer to prevent a latch-up phenomenon or a field inversion phenomenon, thereby preventing variation in characteristics of an active element.

The above object of the present invention ca be achieved by a semiconductor device comprising:

a semiconductor substrate of a first conductivity type;

a well region of a second conductivity type formed in the semiconductor substrate;

a field insulating film formed on a surface region of the semiconductor substrate;

inversion preventing layers of the first conductivity type formed substantially immediately below the field insulating film and having a plurality of impurity concentration peaks in a direction of depth; and active elements formed in the semiconductor substrate isolated by the field insulating film and in the well region.

According to the present invention, the inversion preventing layer of the first conductivity type is formed immediately below the field insulating film, and at least two impurity concentration peaks are formed in the inversion preventing layer. Therefore, a field inversion phenomenon can be prevented by, e.g., an impurity concentration peak located in a position close to the major surface of the semiconductor device, and a latch-up phenomenon can be prevented by an impurity concentration peak located in a position deep from the major surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A to 6C are sectional views showing a semiconductor device according to the second embodiment of the present invention in an order of manufacturing steps;

FIGS. 7A 7B are views each showing a profile of an impurity concentration of the second embodiment;

FIGS. 8A to 8C are sectional views showing a semiconductor device according to the third embodiment of the present invention in an order of manufacturing steps;

FIGS. 10A to 10C are sectional views showing a semiconductor device according to the fourth embodiment of the present invention in an order of manufacturing steps;

FIG. 11 is a view showing a profile of an impurity concentration of the fourth embodiment.

FIGS. 12A to 12C are sectional views showing a semiconductor device according to the fifth embodiment of the present invention in an order of manufacturing steps; and FIG. 13 is a view showing a profile of an impurity concentration of the fifth embodiment.

DETAILED DESCRIPTION OF THE PREFERRED EMBODIMENTS

A semiconductor device according to an embodiment of the present invention and a method of manufacturing the same will be described below with reference to the accompanying drawings.

FIGS. 4A to 4F are sectional views showing a semiconductor device according to the first embodiment of the present invention in an order of manufacturing steps.

Figure 1:
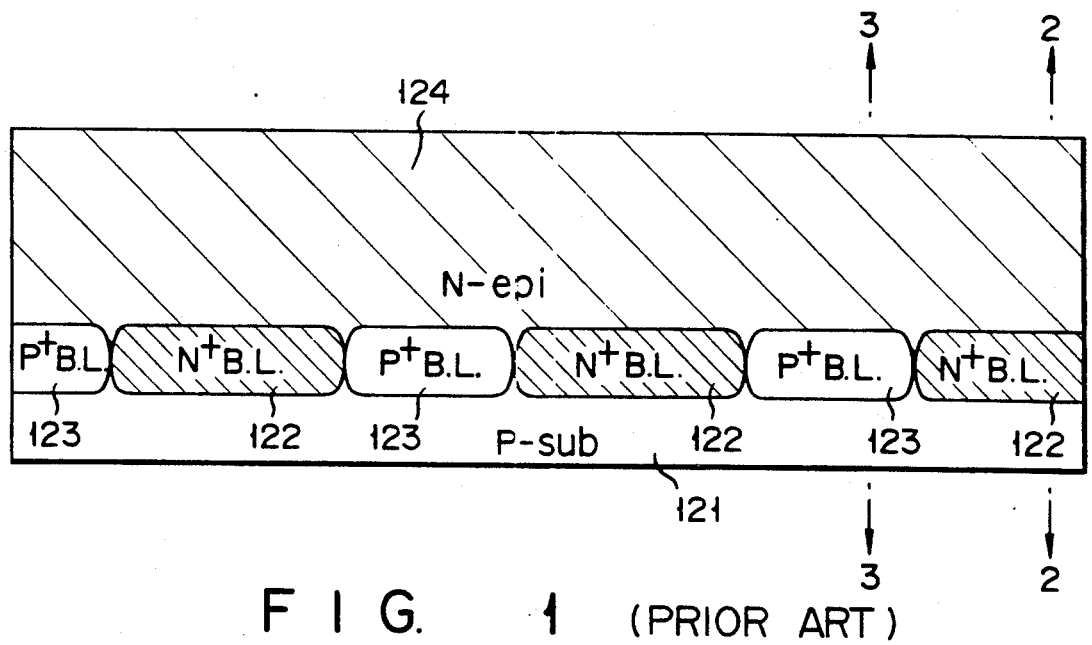
FIG. 1 is a sectional view showing a conventional semiconductor device in one manufacturing step.
Figure 2:
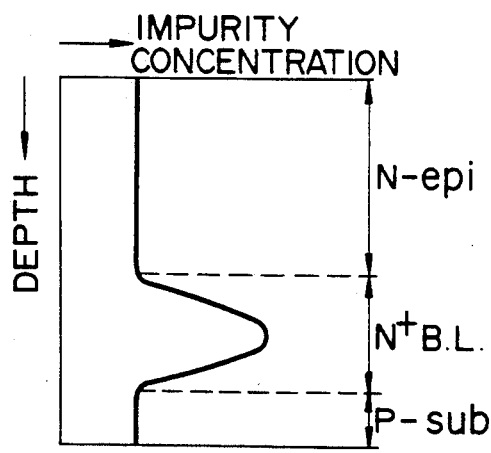
FIG. 2 is a view showing a profile of an impurity concentration taken along a line 2—2 in FIG. 1.
Figure 3:
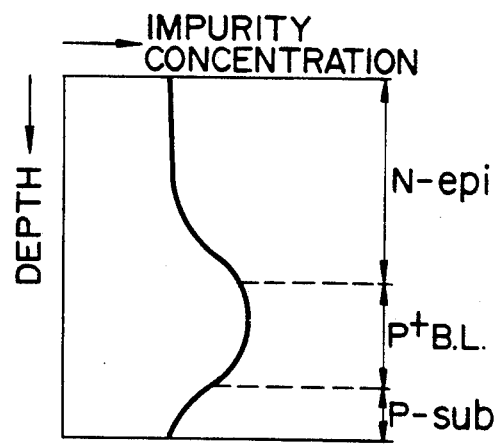
FIG. 3 is a view showing a profile of an impurity concentration taken along a line 3—3 in FIG. 1.
Figure 4A:
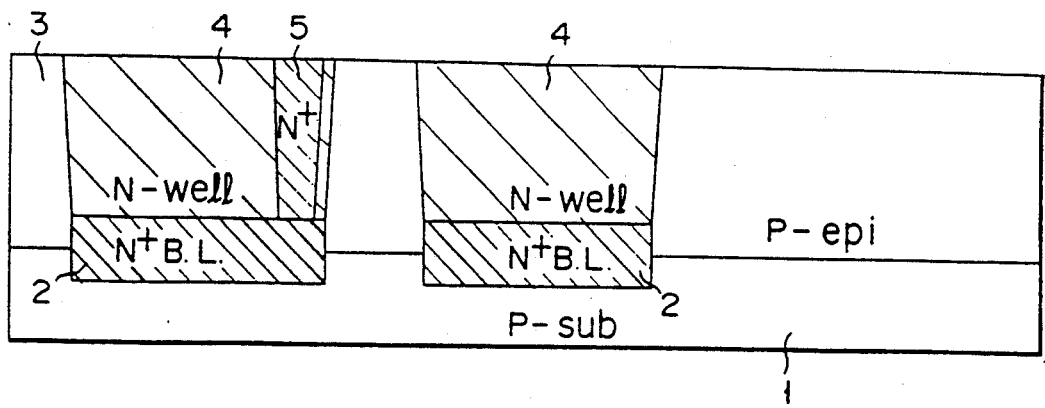
FIGS. 4A to 4F are sectional views showing a semiconductor device according to the first embodiment of the present invention in an order of manufacturing steps.

As shown in FIG. 4A, antimony (Sb), for example, as an n-type impurity is vapor-phase-diffused in predetermined regions on the surface of a p-type semiconductor substrate 1 having a specific resistance of about $20\Omega\cdot cm$ and an orientation of (100) to selectively form high-concentration n+-type buried layers (N+B.L.) 2 having a specific resistance of about $15\Omega/\square$. A p-type epitaxial layer 3 having a specific resistance of about $4\Omega\cdot cm$ is formed by, e.g., a CVD method to have a thickness of about 2 $\mu m$ on the substrate 1 in which the n+-type buried layers 2 are formed. Phosphorus (P), for example, as an n-type impurity is selectively ion-implanted in the p-type epitaxial layer 3 in correspondence with the n+-type buried layers 2 and thermally diffused to reach the layers 2 at a temperature of, e.g., 1,100° C., thereby forming n-type well regions 4. Phosphorus as an n-type impurity is selectively ion-implanted in a predetermined n-type well region 4 and thermally diffused to reach the layers 2 at a temperature of, e.g., 1,100° C., thereby forming a high-concentration n+-type region 5 serving as a collector extraction region of a bipolar transistor.

As shown in FIG. 4A, a p-type buried layer, which is conventionally formed to serve as an inversion preventing layer, is not formed.

Figure 4B:
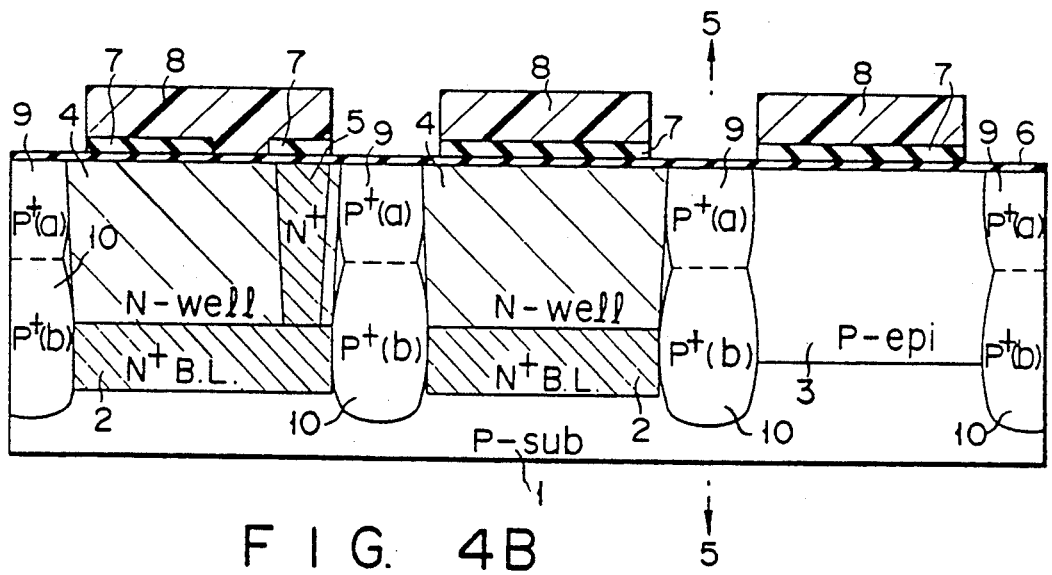

As shown in FIG. 4B, a thermal oxide film 6 having a thickness of about 1,000 Å is formed on the entire surface of the resultant structure by a thermal oxide method at a temperature of, e.g., 950° C. A nitride film 7 having a thickness of about 3,000 Å is formed on the entire surface of the thermal oxide film 6 by, e.g., an LPCVD method. The nitride film 7 is patterned in correspondence with formation positions of the field oxide film by, e.g., photolithography using a photoresist (not shown). A photoresist 8 is coated on the entire surface of the resultant structure and patterned by photolithography in correspondence with inversion preventing layers to be formed immediately below the field oxide film. The photoresist 8 is used as a mask to perform ion implantation of boron (B), for example, as a p-type impurity. This ion implantation is performed twice under the conditions of an acceleration voltage of 50 keV and a dose of $5\times10^{13}$ cm$^{-2}$ and the conditions of an acceleration voltage of 1.5 MeV and a dose of $1\times10^{14}$ cm$^{-2}$, thereby forming p-type inversion preventing layers 9 and 10 (P+(a) and P+(b)) in different depths. The order of the above two ion implantation operations is not particularly limited.

An impurity concentration peak of the p+-type inversion preventing layer 10 formed in a deeper position from the major surface of the semiconductor device is set at a position close to a boundary between the p-type semiconductor substrate 1 and the p-type epitaxial layer 3.

By setting the impurity concentration peak at the position near the boundary as described above, a satisfactory impurity concentration for forming an inversion preventing layer can be obtained from a region in the substrate 1 to a region in the epitaxial layer 3. In addition, since the n+-type buried layers 2 are present near the boundary, an effect of preventing punch through between the layers 2 can be further improved by locally increasing the impurity concentration of the p+-type inversion preventing layer 10 near the boundary.

Figure 5:
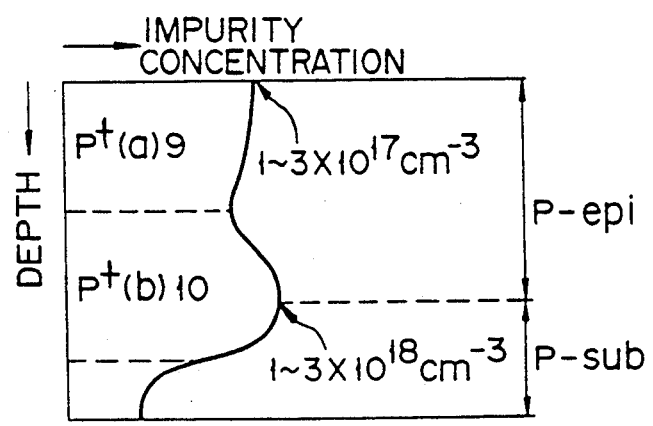
FIG. 5 is a view showing a profile of an impurity concentration taken along a line 5—5 in FIG. 4B.

FIG. 5 is a view showing a profile of an impurity concentration taken along a line 5—5 in FIG. 4B. As shown in FIG. 5, an impurity concentration is about $1\times10^{17}$ to $3\times10^{17}$ cm$^{-3}$ at an impurity concentration peak in the p+-type inversion preventing layer 9 formed near the major surface of the device. An impurity concentration is about $1\times10^{18}$ to $3\times10^{18}$ cm$^{-3}$ at an impurity concentration peak in the p+-type inversion preventing layer 10. This peak is set in the boundary between the p-type semiconductor substrate 1 and the p+type epitaxial layer 3. The p−-type inversion preventing layer 10 is formed to be in contact with the n+-type buried layers 2. The p+-type inversion preventing layer 9 is formed to be in contact with the n-type well regions 4.

Note that the photoresist 8 having a high ion-implantation resistance is used as a mask during the above ion implantation. However, the same ion shield effect as that obtained by the photoresist 8 can be obtained by using an insulating layer such as a plasma oxide film having a thickness of about 3 μm as a mask.

Figure 4C:
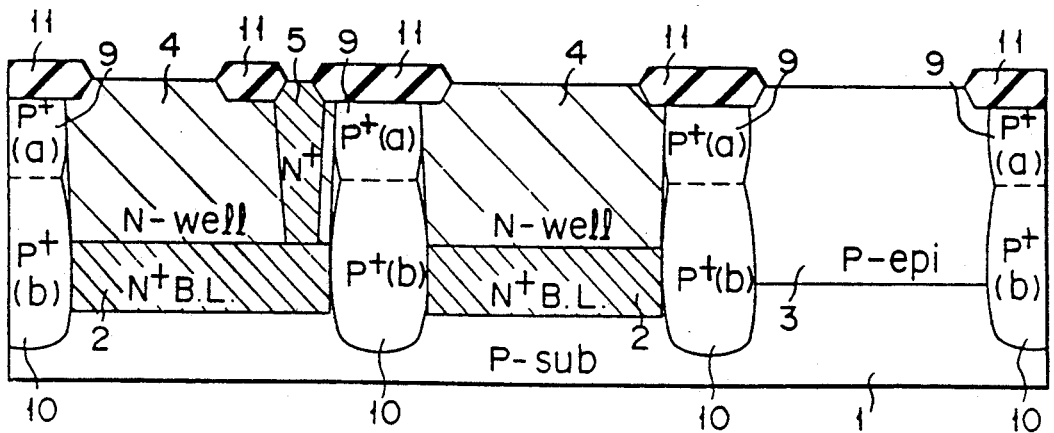

As shown in FIG. 4C, after the photoresist 8 is removed, the nitride film 7 is used as an oxide-resistant mask to perform thermal oxidation, thereby forming a field oxide film 11 as an element isolation region having a thickness of about 8,000 Å.

Figure 4D:
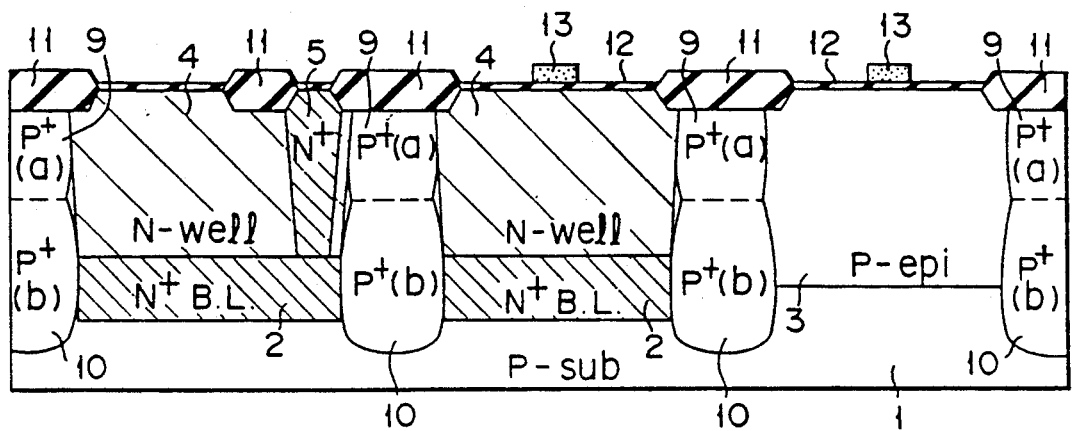

As shown in FIG. 4D, a gate oxide film 12 having a thickness of about 250 Å is formed on the surface of the element region isolated by the field oxide film 11 in an HCl+$O_2$ mixed atmosphere at a temperature of 950° C. Boron, for example, as a p-type impurity is selectively ion-implanted to control threshold values of a p+-type internal base formation region of a bipolar transistor and n- and p-channel MOSFETs. This boron is not shown in FIG. 4D but denoted by reference numeral 15 in FIG. 4E.

A polysilicon layer is formed on the entire surface of the resultant structure to have a thickness of about 4,000 Å by, e.g., an LPCVD method. The polysilicon layer is treated in a $POCl_3$ atmosphere at a temperature of 950° C. to obtain a conductivity (n+type). This polysilicon layer is patterned by photolithography using a photoresist (not shown) and an RIE method to form gates 13 of MOSFETs.

Figure 4E:
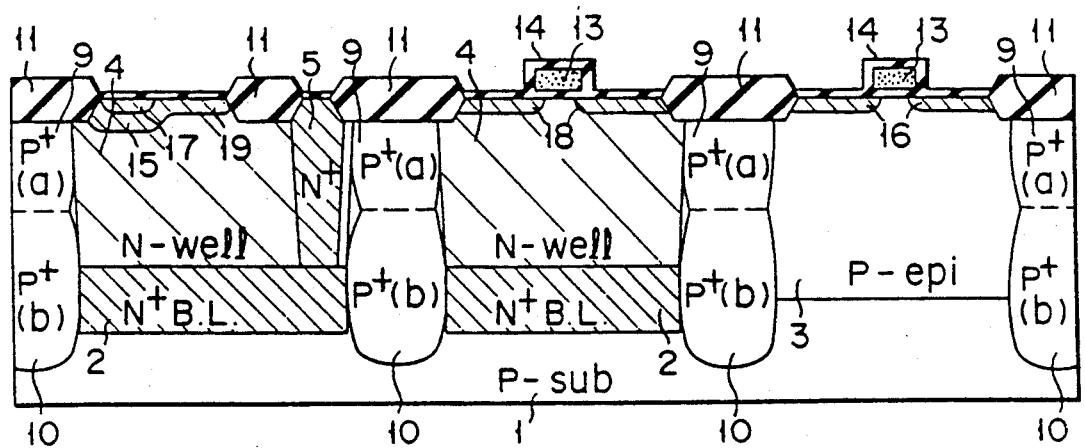

As shown in FIG. 4E, wet etching using $NH_4F$, for example, is performed to selectively remove the gate oxide film 12 by using the gates 13 consisting of the polysilicon layer as masks, thereby temporarily exposing the element region surface. An oxide film 14 is formed on the exposed element region surface by a thermal oxide method. In this thermal oxidation, the surfaces of the gates 13 are also oxidized.

An n-type impurity, e.g., arsenic (As) is selectively ion-implanted in the n-type well regions 4 and the p-type epitaxial layer 3 to form an n+-type emitter region 17 of a bipolar transistor and an n+-type source/drain region 16 of an n-channel MOSFET. A p-type impurity, e.g., boron (B) is selectively ion-implanted in the n-type well regions 4 to form a p+-type source/drain region 18 of a p-channel MOSFET and a p+-type external base region 19 of the bipolar transistor.

Figure 4F:
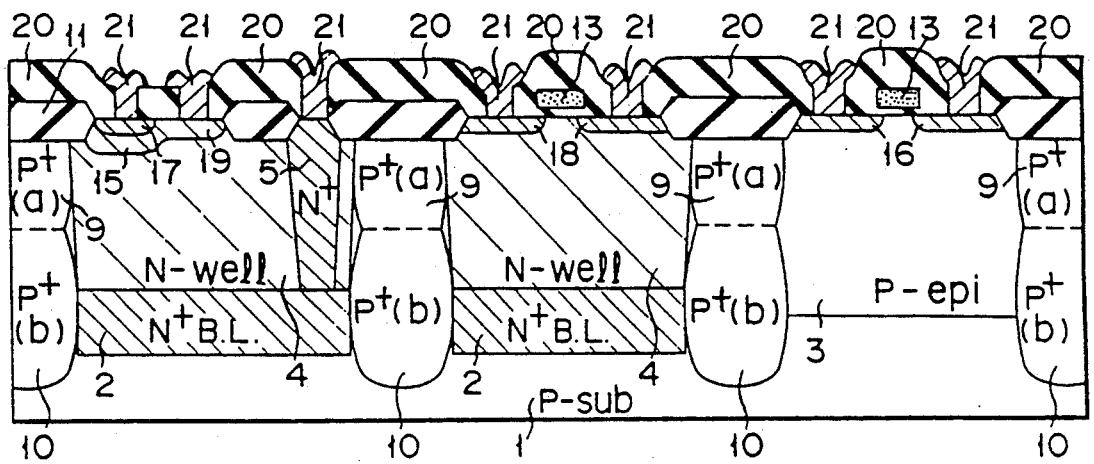

As shown in FIG. 4F, an insulating interlayer 20 having a two-layered structure consisting of a CVD oxide film and a BPSG film is formed on the entire surface of the resultant structure by, e.g., an LPCVD method. The resultant structure is heat-treated in a $POCl_3$ atmosphere at a temperature of, e.g., 950° C. to activate the p−-type internal base region 15, the n+-type source/drain region 16, the n+-type emitter region 17, the p+-type source/drain region 18, and the p+-type external base region 19. As a result, desired characteristics such as a current gain $h_{fe}$ are realized in the bipolar transistor. Contact holes are selectively formed in the insulating interlayer 20 by photolithography using a photoresist (not shown) and an RIE method. An aluminum layer 21 is formed on the entire surface including portions in the contact holes by, e.g., a sputtering method and patterned to obtain a predetermined wiring shape by photolithography using a photoresist (not shown) or the like.

The resultant structure is sintered at a temperature of, e.g., 400° C. to 450° C. to stabilize characteristics of the elements in the device, thereby completing the Bi-CMOS semiconductor device according to the first embodiment of the present invention.

According to the above first embodiment, the impurity concentration peaks of the p+-type inversion preventing layers 9 and 10 present immediately below the field oxide film 11 are set to be $1 \times 10^{17}$ to $3 \times 10^{17}$ cm$^{-3}$ and $1 \times 10^{18}$ to $3 \times 10^{18}$ cm$^{-3}$, respectively, as described above. That is, a sufficiently high impurity concentration is obtained to increase an inversion resistance of each of the layers 9 and 10. Therefore, a latch-up phenomenon can be prevented in the p−-type inversion preventing layer 10 formed in contact with the n+-type buried layers 2.

In addition, a field inversion phenomenon can be prevented in the p+-type inversion preventing layer 9 present near the major surface of the device. Since the inversion resistances of the layers 9 and 10 are increased, a margin with respect to a parasitic element operation, e.g., the latch-up phenomenon or the field inversion phenomenon as described above can be improved as compared with that of a conventional CMOS or Bi-CMOS semiconductor device.

In the first embodiment, the impurity concentration of the p+-type inversion preventing layer 9 is set to be $1 \times 10^{17}$ to $3 \times 10^{17}$ cm$^{-3}$, and that of the p+-type inversion preventing layer 10 is set to be $1 \times 10^{18}$ to $3 \times 10^{18}$ cm$^{-3}$. However, the impurity concentrations can be set to be higher values.

In the manufacturing method according to the first embodiment, after the p-type epitaxial layer 3 is formed, boron is ion-implanted as an impurity to form the p+-type inversion preventing layers 9 and 10 having different depths. Therefore, since a leakage amount of boron having a high diffusion coefficient into the p-type epitaxial layer 3 is small, not a dull profile, but a desired profile, can be obtained for an impurity concentration.

As described above, a leakage amount of boron as a p-type impurity for forming the p+-type inversion preventing layers 9 and 10 into the p-type epitaxial layer 3 is small. Therefore, even when an active element having a micro element structure is formed in the p-type epitaxial layer 3, a highly reliable active element which has small variations in various characteristics and can stably operate, can be obtained.

In the above first embodiment, the number of impurity concentration peaks in the inversion preventing layers is two. However, the number of impurity concentration peaks is not limited to that of the above first embodiment, but may be three or more.

A semiconductor device according to the second embodiment of the present invention and a method of manufacturing the same will be described below with reference to FIGS. 6A to 6C.

Figure 6A:
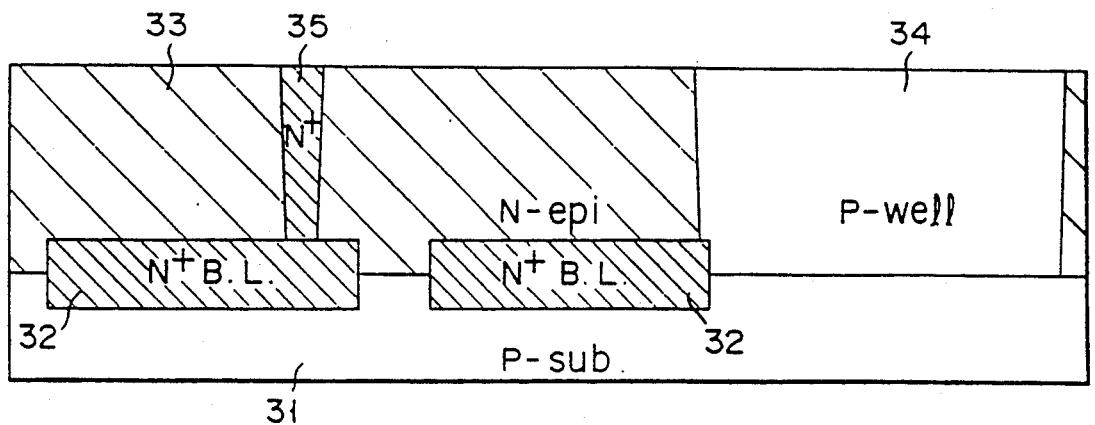

As shown in FIG. 6A, antimony, for example, as an n-type impurity is vapor-phase-diffused in predetermined regions on the surface of a p-type semiconductor substrate 31 to selectively form high-concentration n+-type buried layers (N+B.L.) 32, in the same manner as the first embodiment. An n-type epitaxial layer 33 is formed by, e.g., a CVD method on the p-type semiconductor substrate 31 in which the n+-type buried layers 32 are formed. Phosphorus, for example, as an n-type impurity is selectively ion-implanted in a predetermined position in the n-type epitaxial layer 33 and thermally diffused to reach the n+-type buried layers 32 and the same manner as in the first embodiment, thereby forming a high-concentration n+-type region 35 serving as a collector extraction region of a bipolar transistor. Boron, for example, as a p-type impurity is selectively ion-implanted in a predetermined position in the n-type epitaxial layer 33 and thermally diffused to reach the n+-type buried layers 32 in the same manner as in the first embodiment, thereby forming a high-concentration p-type well region 34.

Figure 6B:
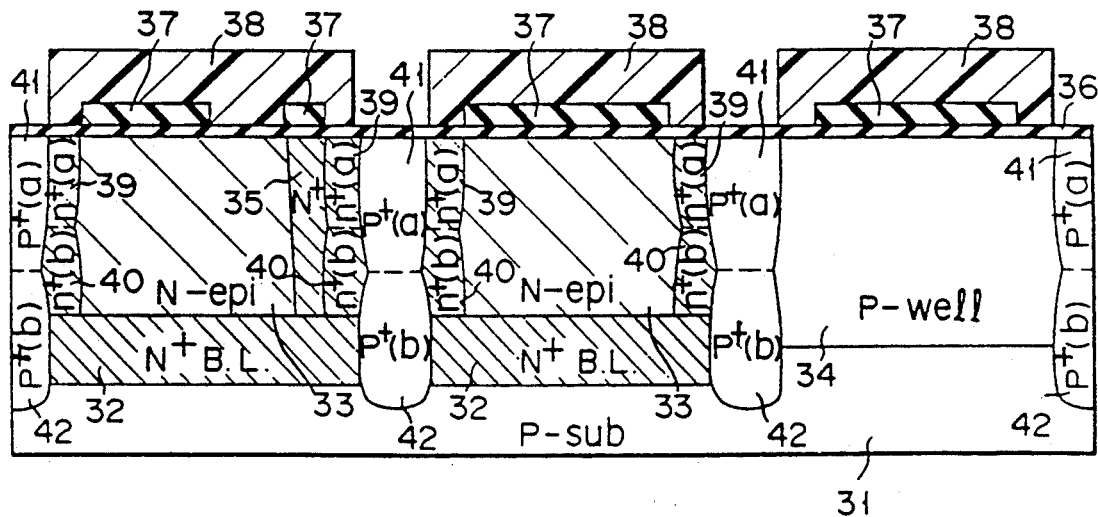

As shown in FIG. 6B, a thermal oxide film 36 is formed on the entire surface of the resultant structure by, e.g., a thermal oxide method in the same manner as in the first embodiment. A nitride film 37 is formed on the entire surface of the thermal oxide film 36 by, e.g., an LPCVD method. The nitride film 37 is patterned by photolithography using a photoresist (not shown) to form a predetermined field oxide film. A photoresist (not shown) is coated o the entire surface of the resultant structure and patterned by photolithography in correspondence with inversion preventing layers to be formed immediately below the field oxide film. The photoresist (not shown) is used as a mask to perform ion implantation of phosphorus, for example, as an n-type impurity. This ion implantation is performed twice under the conditions of an acceleration voltage of 90 keV and a dose of $5 \times 10^{13}$ cm$^{-2}$ and the conditions of an acceleration voltage of 1.8 MeV and a dose of $1 \times 10^{14}$ cm$^{-2}$ thereby forming n+-type inversion preventing layers 39 and 40 (N+(a) and N+(b)) in different depths. The photoresist (not shown) is removed, and a photoresist 38 is coated on the entire surface of the resultant structure and patterned by photolithography in correspondence with p+-type inversion preventing layers to be formed immediately below the field oxide film. The photoresist 38 which is patterned in correspondence with p+-type inversion preventing layers is used as a mask to perform ion implantation of boron, for example, as a p-type impurity. This ion implantation is performed twice under the conditions of an acceleration voltage of 50 keV and a dose of $5 \times 10^{13}$ cm$^{-2}$ and the conditions of an acceleration voltage of 1.5 MeV and a dose of $1 \times 10^{14}$ cm$^{-2}$, thereby forming p+-type inversion preventing layers 41 and 42 (P+(a) and P+(b)) in different depths. At this time, the p+-type inversion preventing layer 42 is formed to be in contact with, e.g., the n+-type buried layer 32 in the same manner as in the first embodiment.

FIGS. 7A and 7B show profiles of impurity concentrations of the p+-type inversion preventing layers and 42 and the n+-type inversion preventing layers 39 and 40, respectively. Each impurity concentration peak in the shallower layers 39 and 41 is set to be $1 \times 10^{17}$ to $3 \times 10^{17}$ cm$^{-3}$, and each impurity concentration peak in the deeper layers 40 and 42 is set to be $1 \times 10^{18}$ to $3 \times 10^{18}$ cm$^{-3}$.

The order of impurity ion implantation operation for forming the n+-type inversion preventing layers 39 and 40 and impurity ion implantation operation for forming the p+-type inversion preventing layers 41 and 42 may be reversed to that of this embodiment.

As shown in FIG. 6C, a field oxide film 43 serving as an element isolating region is formed in the same step as in the first embodiment. Gate oxide films 44 of MOSFETs each having a predetermined thickness are formed on the surfaces of element regions isolated by the field oxide films 43. Gates 45 of the MOSFETs made of, e.g., polysilicon and having predetermined shapes are formed. A p−-type internal base region 46, a p+-type external base region 50, and an n+-type emitter region 48 of a bipolar transistor, an n+-type source/drain region 47 of a n-channel MOSFET, and a p+-type source/drain region 49 of a p-channel MOSFET are respectively formed. In addition, an insulating interlayer 51 having a two-layered structure consisting a CVD oxide film and a BPSG film is formed on the entire surface of the resultant structure. Contact holes are selectively formed in the insulating interlayer 51, and wiring layers 52 made of, e.g., aluminum are formed in the holes. The resultant structure is sintered to stabilize characteristics of the elements in the device, thereby completing the Bi-CMOS semiconductor device according to the second embodiment of the present invention.

According to the above second embodiment, as in the first embodiment, a latch-up phenomenon or a field inversion phenomenon of the device can be prevented by the p+-type inversion preventing layers 41 and 42 and the n+-type inversion preventing layers 39 and 40 each having a sufficiently high impurity concentration, and a margin with respect to a parasitic element operation can be improved.

In addition, p−-type inversion preventing layers 41 and 42 are formed by performing ion implantation of boron twice after the n-type epitaxial layer 33 and the p-type well region 34 are formed. Therefore, even when the inversion preventing layers 41 and 42 are formed by ion-implanting boron serving as a p-type impurity having a high diffusion coefficient as in the first embodiment, not a dull profile, but a desired profile may be obtained for an impurity concentration.

Furthermore, a leakage amount of boron into the n-type epitaxial layer 33 is small. Therefore, even when an active element having a micro element structure is formed in the n-type epitaxial layer 33, a highly reliable active element which has small variations in various characteristics and can stably operate can be obtained.

In the second embodiment, the number of impurity concentration peaks in the p+-type or n+-type inversion preventing layers (39 to 42) is two, as in the first embodiment. However, the number of impurity concentration peaks is not limited to that of the above second embodiment, but may be three or more.

The number of ion-implantation operations of an impurity for forming an inversion preventing layer is two. However, the number of ion-implantation operations is not limited to that of the above second embodiment, but may be three or more.

A semiconductor device according to the third embodiment of the present invention and a method of manufacturing the same will be described below with reference to FIGS. 8A to 8C. The third embodiment explains a case wherein the present invention is applied to a semiconductor device having an epitaxial layer on a semiconductor substrate.

As shown in FIG. 8A, phosphorus, for example, as an n-type impurity is selectively ion-implanted in a predetermined position of a p-type semiconductor substrate 61 and thermally diffused, thereby forming an n-type well region 62.

As shown in FIG. 8B, a thermal oxide film 63 is formed on the entire surface of the p-type semiconductor substrate 61 and the n-type well region 62 by, e.g., a thermal oxide method. A nitride film 64 is formed on the entire surface of the resultant structure by, e.g., an LPCVD method. The nitride film 64 is patterned into a predetermined field oxide film forming pattern by photolithography using a photoresist (not shown). A photoresist 65 is coated on the entire surface of the resultant structure and patterned by photolithography in correspondence with p+-type inversion preventing layers to be formed immediately below the field oxide film. The photoresist 65 is used as a mask to perform ion implantation of boron, for example, as a p-type impurity. This ion implantation is performed twice under the conditions of an acceleration voltage of 50 keV and a dose of $5 \times 10^{13}$ cm$^{-2}$ and the conditions of an acceleration voltage of 1.5 MeV and a dose of $1 \times 10^{14}$ cm$^{-2}$, thereby forming p+-type inversion preventing layers 66 and 67 in different depths. At this time, the p+-type inversion preventing layers 66 and 67 are formed to be into contact with, e.g., the n-type well region 62.

Figure 9:
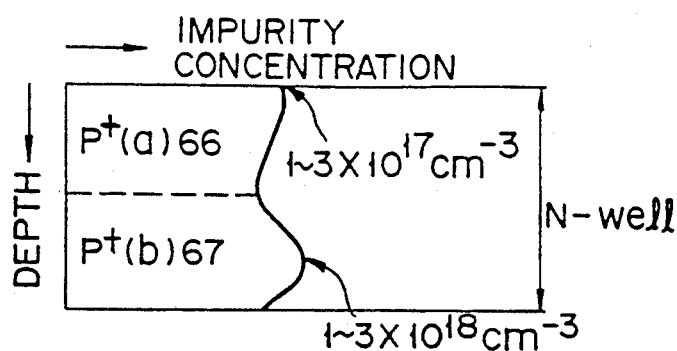
FIG. 9 is a view showing a profile of an impurity concentration of the third embodiment.

FIG. 9 shows profiles of impurity concentrations of the inversion preventing layers 66 and 67. An impurity concentration peak in the shallower inversion preventing layer 66 is set to be $1 \times 10^{17}$ cm$^{-3}$ to $3 \times 10^{17}$, and an impurity concentration peak in the deeper inversion preventing layer 67 is set to be $1 \times 10^{18}$ to $3 \times 10^{18}$ cm$^{-3}$.

As shown in FIG. 8C, a field oxide film 68, serving as an element isolating region, is formed in the same manner as in the first and second embodiment. Gate oxide films 69 of MOSFETs each having a predetermined thickness are formed on the surfaces of the element regions isolated by the field oxide film 68. Gates 70 of the MOSFETs made of, e.g., polysilicon and having predetermined shapes are formed. An n+-type source/-drain region 71 of the n-channel MOSFET and a p+-type source/drain region 72 of the p-channel MOSFET are formed. An insulating interlayer 73 having a two-layered structure consisting, e.g., a CVD oxide film and a BPSG film is formed on the entire surface of the resultant structure. Contact holes are selectively formed in the insulating interlayer 73, and wiring layers 74 made of, e.g., aluminum are formed in the holes. The resultant structure is sintered to stabilize characteristics of the elements in the device, thereby completing the CMOS semiconductor device according to the third embodiment of the present invention.

According to the above third embodiment, as in the first and second embodiments, a latch-up phenomenon or a field inversion phenomenon of the device can be prevented by the p+-type inversion preventing layers 66 and 67 each having a sufficiently high impurity concentration, and a margin with respect to a parasitic element operation can be improved.

In addition, p+-type inversion preventing layers 66 and 67 are formed by performing ion implantation of boron twice. Therefore, even when the inversion preventing layers 66 and 67 are formed by ion-implanting boron serving as a p-type impurity having a high diffusion coefficient, not a dull profile, but a desired profile, may be obtained for an impurity concentration.

In a conventional method, in order to form a p-type inversion preventing layer in a deeper position from the surface of the semiconductor device as described in the third embodiment, a p-type buried layer must be formed on the surface of the semiconductor substrate, and then an epitaxial layer must be formed. However, according to the third embodiment, a p-type inversion preventing layer can be formed in a deeper position from the surface of the semiconductor device without forming an epitaxial layer, thereby reducing manufacturing cost.

Furthermore, since the p+-type inversion preventing layers 66 and 67 are formed after formation of the n-type well region 62, a leakage amount of boron, for example, as a p-type impurity is small. Therefore, even when an active element having a micro element structure is formed in the p-type semiconductor substrate 61, a highly reliable active element which has small variations in various characteristics and can stably operate can be obtained.

In the third embodiment, the number of impurity concentration peaks in the p+-type inversion preventing layers 66 and 67 is two. However, the number of impurity concentration peaks is not limited to that of the above third embodiment but may be three or more.

The number of ion-implantation operations of an impurity for forming an inversion preventing layer is two. However the number of ion-implantation operations is not limited to that of the above third embodiment but may be three or more.

A semiconductor device according to the fourth embodiment of the present invention and a method of manufacturing the same will be described below with reference to FIGS. 10A to 10C.

Figure 10A:
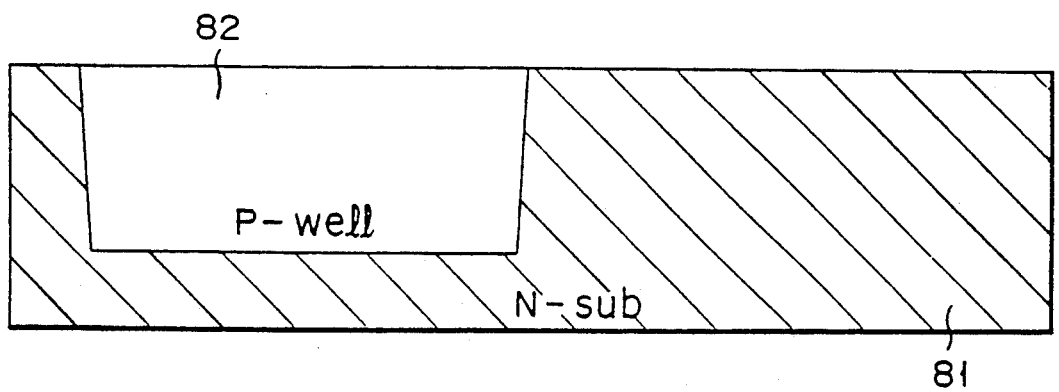

As shown in FIG. 10A, boron, for example, as a p-type impurity is selectively ion-implanted in a predetermined position of an n-type semiconductor substrate 81 and thermally diffused, thereby forming a p-type well region 82.

Figure 10B:
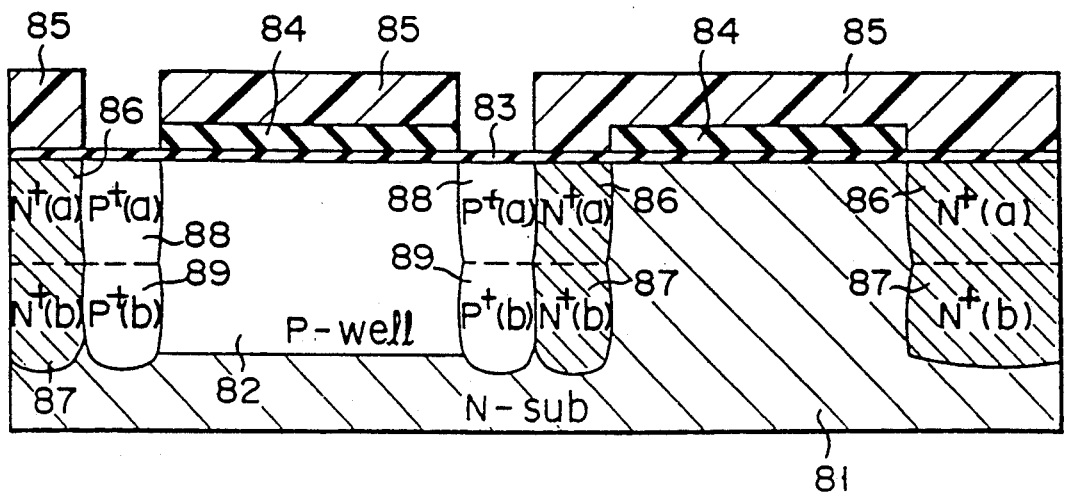

As shown in FIG. 10B, a thermal oxide film 83 is formed on the entire surface of the n-type semiconductor substrate 81 and the p-type well region 82 by, e.g., a thermal oxide method. A nitride film 84 is formed on the entire surface of the resultant structure by, e.g., an LPCVD method. The nitride film 84 is patterned by photolithography using a photoresist (not shown) to form a predetermined field oxide film. A photoresist (not shown) is coated on the entire surface of the resultant structure and patterned by photolithography in correspondence with n+-type inversion preventing layers to be formed immediately below the field oxide film. The photoresist is used as a mask to perform ion implantation of phosphorus, for example, as an n-type impurity. This ion implantation is performed twice under the conditions of an acceleration voltage of 90 keV and a dose of $5 \times 10^{13}$ cm$^{-2}$ and the conditions of an acceleration voltage of 1.5 MeV and a dose of $5 \times 10^{14}$ cm$^2$, thereby forming n+-type inversion preventing layers 86 and 87 (N−(a), N+(b)) in different depths. The photoresist (not shown) is removed, and a photoresist 85 is coated on the entire surface of the resultant structure again and patterned by photolithography to form p+-type inversion preventing layers in contact with the n+-type inversion preventing layers 86 and 87 immediately below the field oxide film 83. The photoresist 85 which is patterned in correspondence with p+-type inversion preventing layers, is used as a mask to perform ion implantation of boron, for example, as a p-type impurity. This ion implantation is performed twice under the conditions of an acceleration voltage of 50 keV and a dose of $8 \times 10^{13}$ cm$^{-2}$ and the conditions of an acceleration voltage of 1.5 MeV and a dose of $1 \times 10^{14}$ cm$^{-2}$, thereby forming p+-type inversion preventing layers 88 and 89 (P+(b) and P+(b)) in different depths. At this time, the p+-type inversion preventing layers 88 and 89 are formed in contact with the n+-type buried layers 86 and 87, respectively.

FIG. 11 shows profiles of impurity concentrations of the n+-type inversion preventing layers 86 and 87 and the p+-type inversion preventing layers 88 and 89. An impurity concentration peak in the shallower inversion preventing layers 86 and 88 is set to be $1 \times 10^{17}$ cm$^3$ to $3 \times 10^{17}$, and an impurity concentration peak in the deeper inversion preventing layers 87 and 89 is set to be $1 \times 10^{18}$ to $3 \times 10^{18}$ cm$^{-3}$.

Note that the order of the ion implantation operation for forming the n+-type inversion preventing layers 86 and 87 and the ion implantation operation for forming the p+-type inversion preventing layers 88 and 89 may be reversed to that of this embodiment.

As shown in FIG. 10C, a field oxide film 90 serving as an element isolating region is formed on the inversion preventing layers 86 and 88 in the same manner as in the first to third embodiments. Gate oxide films 91 of MOS-FETs each having a predetermined thickness are formed on the surfaces of the element regions isolated by the field oxide film 90. Gates 92 of the MOSFETs made of, e.g., polysilicon and having predetermined shapes are formed. An n+-type source/drain region 93 of the n-channel MOSFET and a p+-type source/drain region 93 of the n-channel MOSFET are formed. An insulating interlayer 95 having a two-layered structure consisting, e.g., a CVD oxide film and a BPSG film is formed on the entire surface of the resultant structure. Contact holes are selectively formed in the insulating interlayer 95, and wiring layers 96 made of, e.g., aluminum are formed in the holes. The resultant structure i sintered to stabilize characteristics of the elements in the device, thereby completing the CMOS semiconductor device according to the fourth embodiment of the present invention.

According to the above fourth embodiment, as in the first to third embodiments, a latch-up phenomenon or a field inversion phenomenon of the device can be prevented by the p+-type inversion preventing layers 88 and 89 and the n+-type inversion preventing layers 86 and 87 each having a sufficiently high impurity concentration, and a margin with respect to a parasitic element operation can be improved.

In addition, p+-type inversion preventing layers 88 and 89 are formed by performing ion implantation of boron twice. Therefore, even when the inversion preventing layers 88 and 89 are formed by ion-implanting boron having a high diffusion coefficient, not a dull, profile but a desired profile, can be obtained for an impurity concentration.

In addition, even when a p-type inversion preventing layer is formed in a deeper position from the surface of the semiconductor device, as described in the third embodiment, an epitaxial layer need not be formed, thereby reducing manufacturing cost.

Furthermore, since the p+-type inversion preventing layers 88 and 89 are formed after formation of the p-type well region 82, a leakage amount of boron, for example, as a p-type impurity, is small. Therefore, even when an active element having a micro element structure is formed in the p-type semiconductor substrate 81, a highly reliable active element which has small variations in various characteristics and can stably operate can be obtained.

At this time, the p+-type inversion preventing layers 88 and 89 are formed to be in contact with, e.g., the n−-type inversion preventing layers 86 and 87.

Note that, in a semiconductor device according to the fourth embodiment and a method of manufacturing the same, the number of impurity concentration peaks in the p+-type inversion preventing layers 88 and 89 or in the n+-type inversion preventing layers 86 and 87 is two. However, the number of impurity concentration peaks is not limited to that of the above fourth embodiment but may be three or more.

The number of ion-implantation operations of an impurity for forming an inversion preventing layer is two. However the number of ion-implantation operations is not limited to that of the above third embodiment but may be three or more.

A semiconductor device according to the fifth embodiment and a method of manufacturing the same will be described below with reference to FIGS. 12A to 12C.

As shown in FIG. 12A, boron, for example, as a p-type impurity is selectively ion-implanted in a predetermined position of an n-type semiconductor substrate 101 and thermally diffused, thereby forming a p-type well region 102. Phosphorus as an n-type impurity is selectively ion-implanted in a predetermined position of an n-type semiconductor substrate 101 and thermally diffused to form an n-type well region 103. This structure is called a twin tub or a twin well.

As shown in FIG. 12B, a thermal oxide film 104 is formed on the entire surface of the resultant structure by, e.g., a thermal oxide method. A nitride film 105 is formed on the entire surface of the thermal oxide film 104 by, e.g., an LPCVD method. The nitride film 105 is patterned by photolithography using a photoresist (not shown) to form a predetermined field oxide film. A photoresist (not shown) is coated on the entire surface of the resultant structure and patterned by photolithography in correspondence with n+-type inversion preventing layers to be formed immediately below the field oxide film. The photoresist is used as a mask to perform ion implantation of phosphorus, for example, as an n-type impurity. This ion implantation is performed twice under the conditions of an acceleration voltage of 90 keV and a dose of $5 \times 10^{13}$ cm$^{-2}$ and the conditions of an acceleration voltage of 1.5 MeV and a dose of $5 \times 10^{14}$ cm$^{-2}$, thereby forming n−-type inversion preventing layers 107 and 108 (N+(a), N+(b)) in different depths. The photoresist (not shown) is removed, and a photoresist 106 is coated on the entire surface of the resultant structure again and patterned by photolithography to form p+-type inversion preventing layers 109 and 110 in contact with the n+-type inversion preventing layers 107 and 108 immediately below the field oxide film. The photoresist 106, which is patterned, is used as a mask to perform ion implantation of boron, for example, as a p-type impurity. This ion implantation is performed twice under the conditions of an acceleration voltage of 50 keV and a dose of $8 \times 10^{13}$ cm$^{-2}$ and the conditions of an acceleration voltage of 1.5 MeV and a dose of $1 \times 10^{14}$ cm$^{-2}$, thereby forming p+-type inversion preventing layers 109 and 110 (P+(a) and P+(b)) in different depths. At this time, the p+-type inversion preventing layers 109 and 110 are formed in contact with, e.g., n+-type buried layers 107 and 108, respectively.

FIG. 13 shows profiles of impurity concentrations of the inversion preventing layers 107 and 108 and the p+-type inversion preventing layers 109 and 110. An impurity concentration peak in the shallower inversion preventing layers 107 and 109 is set to be $1 \times 10^{17}$ cm$^{-3}$ to $3 \times 10^{17}$, and an impurity concentration peak in the deeper p+-type inversion preventing layers 108 and 110 is set to be $1 \times 10^{18}$ to $3 \times 10^{18}$ cm$^{-3}$.

Note that the order of the ion implantation operation for forming the n+-type inversion preventing layers 107 and 108 and the ion implantation operation for forming the p+-type inversion preventing layers 109 and 110 may be reversed to that of this embodiment.

As shown in FIG. 12C, a field oxide film 111, serving as an element isolating region, is formed in the same manner as in the first to fourth embodiments. Gate oxide films 112 of MOSFETs each having a predetermined thickness are formed on the surfaces of the element regions isolated by the field oxide film 111. Gates 113 of the MOSFETs made of, e.g., polysilicon and having predetermined shapes are formed. An n+-type source/drain region 114 of the n-channel MOSFET and a p+-type source/drain region 115 of the p-channel MOSFET are formed. An insulating interlayer 116 having a two-layered structure consisting, e.g., a CVD oxide film and a BPSG film is formed on the entire surface of the resultant structure. Contact holes are selectively formed in the insulating interlayer 116, and wiring layers 117 made of, e.g., aluminum are formed in the holes. The resultant structure is sintered to stabilize characteristics of the elements in the device, thereby completing the CMOS semiconductor device according to the fifth embodiment of the present invention.

According to the above fifth embodiment, as in the first to fourth embodiments, a latch-up phenomenon or a field inversion phenomenon of the device can be prevented by the p+-type inversion preventing layers 109 and 110 and the n+-type inversion preventing layers 107 and 108 each having a sufficiently high impurity concentration, and a margin with respect to a parasitic element operation can be improved.

In addition, p+-type inversion preventing layers 109 and 110 are formed by performing ion implantation of boron twice. Therefore, even when the inversion preventing layers 109 and 110 are formed by ion-implanting boron serving as a p-type impurity having a high diffusion coefficient, not a dull profile, but a desired profile, can be obtained for an impurity concentration.

In addition, even when a p-type inversion preventing layer is formed in a deeper position from the surface of the semiconductor device a described in the third and fourth embodiments, an epitaxial layer need not be formed, thereby reducing manufacturing cost. Furthermore, since the p+-type inversion preventing layers 109 and 110 are formed after formation of the p-type n-type well regions 102 and 103, a leakage amount of boron, for example, as a p-type impurity is small. Therefore, even when an active element having a micro element structure is formed in the n-type semiconductor substrate 101, a highly reliable active element which has small variations in various characteristics and can stably operate can be obtained.

Note that, in the fifth embodiment, the number of impurity concentration peaks in the p+-type inversion preventing layers 109 and 110 or in the n+-type inversion preventing layers 107 and 108 is two. However, the number of impurity concentration peaks is not limited to that of the above fifth embodiment but may be three or more.

The number of ion-implantation operations of an impurity for forming an inversion preventing layer is two. However, the number of ion-implantation operations is not limited to that of the above fifth embodiment but may be three or more.

The present invention can be effectively applied especially to a Bi-CMOS semiconductor device or a CMOS semiconductor device. However, the present invention may be applied as a countermeasure against field inversion or latch-up in various semiconductor devices without being limited to the above semiconductor devices. For example, the present invention can be effectively applied to an analog/digital integrated semiconductor device consisting of bipolar transistors, a hybrid semiconductor device consisting of a charge transfer device and a CMOS, or the like.

Additional advantages and modifications will readily occur to those skilled in the art. Therefore, the invention in its broader aspects is not limited to the specific details, and representative devices, shown and described herein. Accordingly, various modifications may by without departing from the spirit or scope of the general inventive concept as defined by the appended claims and their equivalents.

What is claimed is:

1. A semiconductor device comprising:
   a semiconductor substrate of a first conductivity type with a surface region;
   a plurality of buried layers of a second conductivity type formed in a plurality of portions on said surface region of said semiconductor substrate;
   an epitaxial layer of the second conductivity type formed on said buried layers and on said semiconductor substrate;
   a well region of the first conductivity type formed in said epitaxial layer in contact with said semiconductor substrate;
   a field insulating film formed on a surface region of said epitaxial layer;
   a first inversion preventing layer of the second conductivity type formed immediately below said field insulating film, the first inversion preventing layer having a plurality of impurity concentration peaks, the impurity concentration peak of a deeper portion of the first inversion preventing layer being higher than the impurity concentration peak in a shallower portion of the first inversion preventing layer of the second conductivity type;
   a second inversion preventing layer of the first conductivity type formed immediately below said field insulating film and in contact with the first inversion preventing layer, the second inversion preventing layer having a plurality of impurity concentration peaks, the impurity concentration peak of a deeper portion of the second inversion preventing layer being higher than the impurity concentration peak in a shallower portion of the second inversion preventing layer and the deeper portion being formed in contact with at least the plurality of buried layers; and
   a plurality of active elements formed in said epitaxial layer and in said well region.

2. A device according to claim 1, wherein at least one of said first and second inversion preventing layers is formed in contact with at least one of said plurality of buried layers, and the impurity concentration peak is set higher in said at least one of said first and second inversion preventing layers in contact with one of said plurality of buried layers than in said inversion preventing layer not in contact with one of said plurality of buried layers.

3. A device according to claim 1, wherein one of the impurity concentration peaks of said second inversion preventing layer of the first conductivity type is located near a boundary between said semiconductor substrate and said epitaxial layer.

4. A device according to claim 1, wherein said first inversion preventing layer of the second conductivity type is in contact with said epitaxial layer, said second inversion preventing layer of the first conductivity type, and said plurality of buried layers.

5. A device according to claim 1, wherein an impurity concentration peak in shallower inversion preventing layers of the first and second conductivity types is set to be $1 \times 10^{17}$ to $3 \times 10^{17}$ cm$^{-3}$, and an impurity concentration peak in deeper inversion preventing layers is set to be $1 \times 10^{18}$ to $3 \times 10^{18}$ cm$^{-3}$.

6. The device according to claim 1, further comprising:
a region of the second conductivity type with a high impurity concentration formed in said epitaxial layer in contact with one of said plurality of buried layers.

* * * * *